US012800620B2

(12) United States Patent
Murakami et al.

(10) Patent No.: US 12,800,620 B2
(45) Date of Patent: Nov. 17, 2026

(54) DETECTION CIRCUIT WITH ELECTROMAGNETIC NOISE REDUCTION WIRE ARRANGEMENT

(71) Applicant: Mitsubishi Electric Corporation, Tokyo (JP)

(72) Inventors: Satoshi Murakami, Tokyo (JP); Akira Nakagawa, Tokyo (JP); Masatoshi Saito, Tokyo (JP); Takashi Nagao, Tokyo (JP); Toshiki Nagare, Tokyo (JP)

(73) Assignee: Mitsubishi Electric Corporation, Suwon-si (JP)

( * ) Notice: Subject to any disclaimer, the term of this patent is extended or adjusted under 35 U.S.C. 154(b) by 251 days.

(21) Appl. No.: 18/710,973

(22) PCT Filed: Nov. 26, 2021

(86) PCT No.: PCT/JP2021/043468

§ 371 (c)(1),
(2) Date: May 16, 2024

(87) PCT Pub. No.: WO2023/095306

PCT Pub. Date: Jun. 1, 2023

(65) Prior Publication Data

US 2025/0012833 A1 Jan. 9, 2025

(51) Int. Cl.
*G01R 19/10* (2006.01)
*G01R 1/20* (2006.01)
(Continued)

(52) U.S. Cl.
CPC ............ *G01R 19/10* (2013.01); *G01R 1/203* (2013.01); *G01R 15/16* (2013.01);
(Continued)

(58) Field of Classification Search
CPC ........ G01R 19/10; G01R 1/203; G01R 15/16; G01R 19/0053; H02M 1/0009;
(Continued)

(56) References Cited

U.S. PATENT DOCUMENTS 10,006,947 B2 6/2018 Tsuchida et al.
10,345,353 B2 7/2019 Banerji et al.
(Continued)

FOREIGN PATENT DOCUMENTS

DE 60 2005 002 191 T2 5/2008
JP 2003-14792 A 1/2003
(Continued)

OTHER PUBLICATIONS

International Search Report for International Application No. PCT/JP2021/043468 dated Jan. 11, 2022.
(Continued)

*Primary Examiner* — Raul J Rios Russo
(74) *Attorney, Agent, or Firm* — Sughrue Mion, PLLC

(57) ABSTRACT

A detection circuit includes: a differential; a plus-side detection wire connected between a plus input terminal of the differential amplifier and a detector; a minus-side detection wire connected between a minus input terminal of the differential amplifier and the detector; a first detection wire connected in parallel to the plus-side detection wire between the detector and the plus input terminal of the differential amplifier; and a second detection wire connected in parallel to the minus-side detection wire between the detector and the minus input terminal of the differential amplifier. The first detection wire and the second detection wire are arranged in the electric circuit so as to, by induced voltages generated due to electromagnetic noise, cancel out induced voltages generated on the plus-side detection wire and the minus-side detection wire due to the electromagnetic noise.

22 Claims, 7 Drawing Sheets

(51) Int. Cl.

| | |
|---|---|
| ***G01R 15/16*** | (2006.01) |
| ***G01R 19/00*** | (2006.01) |
| ***H02M 1/00*** | (2007.01) |
| ***H02M 7/537*** | (2006.01) |
| ***H03F 3/45*** | (2006.01) |
| ***H05K 1/02*** | (2006.01) |

(52) U.S. Cl.
CPC ...... *G01R 19/0053* (2013.01); *H02M 1/0009* (2021.05); *H02M 7/537* (2013.01); *H03F 3/45475* (2013.01); *H05K 1/0228* (2013.01); *H05K 2201/09236* (2013.01); *H05K 2201/09245* (2013.01); *H05K 2201/09672* (2013.01); *H05K 2201/097* (2013.01)

(58) Field of Classification Search
CPC ............... H02M 7/537; H03F 3/45475; H05K 2201/09236; H05K 2201/09245; H05K 2201/09672; H05K 2201/097; H05K 1/0228
USPC ...................................................... 324/123 C
See application file for complete search history.

(56) References Cited

U.S. PATENT DOCUMENTS

| | | | | |
|---|---|---|---|---|
| 2003/0142452 | A1* | 7/2003 | Heider | H01H 9/167 361/103 |
| 2004/0056661 | A1 | 3/2004 | Maeda et al. | |
| 2005/0283325 | A1 | 12/2005 | Mottola | |
| 2010/0085034 | A1* | 4/2010 | Sakayori | G01R 19/0092 361/56 |
| 2016/0169953 | A1* | 6/2016 | Skipper | G01K 7/026 324/543 |
| 2021/0006134 | A1 | 1/2021 | Ichikawa et al. | |
| 2021/0036619 | A1 | 2/2021 | Murakami et al. | |
| 2021/0231708 | A1* | 7/2021 | Minami | G01R 19/0023 |
| 2022/0050127 | A1 | 2/2022 | Kikuchi et al. | |
| 2022/0131464 | A1* | 4/2022 | Hosotani | H02M 1/0048 |
| 2023/0024063 | A1* | 1/2023 | Burgermeister | H02M 7/5395 |

FOREIGN PATENT DOCUMENTS

| | | | |
|---|---|---|---|
| JP | 2003-114243 | A | 4/2003 |
| JP | 2003-121477 | A | 4/2003 |
| JP | 2015-2333 | A | 1/2015 |
| JP | 2015-17832 | A | 1/2015 |
| JP | 6254977 | B2 | 12/2017 |
| JP | 2019-45254 | A | 3/2019 |
| JP | 2020-46207 | A | 3/2020 |
| WO | 03/032478 | A1 | 4/2003 |
| WO | 2019/171997 | A1 | 9/2019 |
| WO | 2019/202730 | A1 | 10/2019 |

OTHER PUBLICATIONS

Communication dated Jun. 8, 2026, issued in Indian Application No. 202427038840.

* cited by examiner

FIG.2

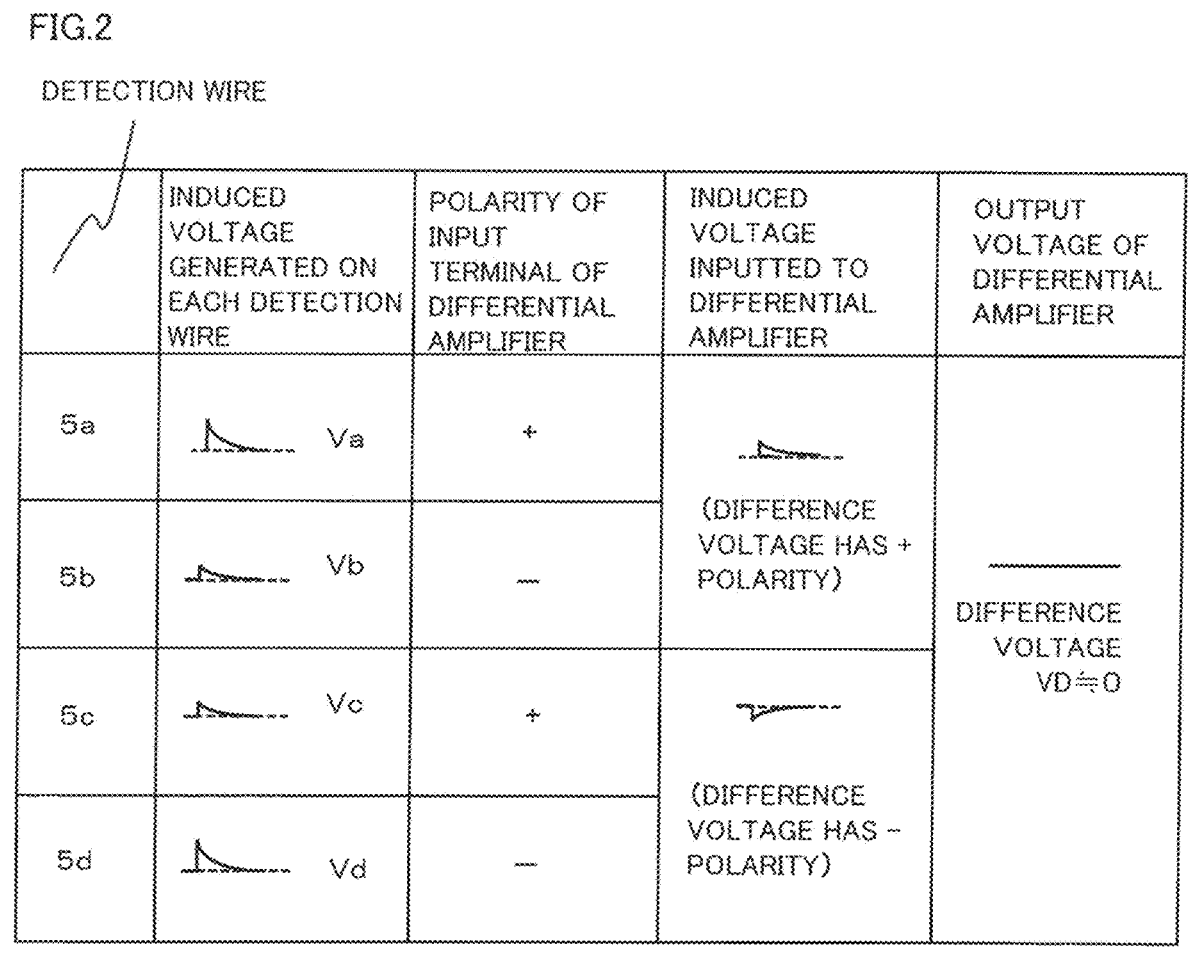

DETECTION WIRE

| | INDUCED VOLTAGE GENERATED ON EACH DETECTION WIRE | POLARITY OF INPUT TERMINAL OF DIFFERENTIAL AMPLIFIER | INDUCED VOLTAGE INPUTTED TO DIFFERENTIAL AMPLIFIER | OUTPUT VOLTAGE OF DIFFERENTIAL AMPLIFIER |
|---|---|---|---|---|
| 5a | Va | + | (DIFFERENCE VOLTAGE HAS + POLARITY) | DIFFERENCE VOLTAGE VD≒0 |
| 5b | Vb | − | | |
| 5c | Vc | + | (DIFFERENCE VOLTAGE HAS − POLARITY) | |
| 5d | Vd | − | | |

| | | | | | |
|---|---|---|---|---|---|
| INDUCED ELECTROMOTIVE FORCE V | 10 +⊿ | 8 +⊿ | 6 +⊿ | 4 +⊿ | ... |
| DIFFERENCE VOLTAGE VD | +2 | | −2 | | ... |

DETECTION CIRCUIT WITH ELECTROMAGNETIC NOISE REDUCTION WIRE ARRANGEMENT

This is a National Stage Application of International Application No. PCT/JP2021/043468 filed Nov. 26, 2021.

TECHNICAL FIELD

The present disclosure relates to a detection circuit for detecting current or voltage.

BACKGROUND ART

In a conventional current detection circuit, a resistor is interposed on a current path through which main current flows during circuit operation, and a current value is obtained on the basis of voltage generated between both ends of the resistor when current flows through the resistor. Such a resistor is also called a shunt resistor. The current detection circuit using the shunt resistor has an advantage that the circuit configuration can be simplified. In the current detection circuit using the shunt resistor, the voltage generated between both ends of the resistor is inputted to a differential amplifier so as to be combined, thus reducing interference voltages which are the influence of electromagnetic noise interfering in the same phase. However, the interference voltages inputted together when the voltage generated between both ends of the resistor is inputted to the differential amplifier are not actually at the same level, and a difference between the interference voltages is detected at an output from the differential amplifier, thus hampering accurate detection for current. Regarding this problem, in order to accurately detect current without being influenced by interference from electromagnetic noise, it has been disclosed that two current detection circuits each composed of a shunt resistor, a current detection wire, and a differential amplifier, are provided, interference voltages at the same level are generated on the two circuits, and outputs from the two circuits are inputted to another differential amplifier, thus canceling out the influence of electromagnetic noise (for example, Patent Document 1).

CITATION LIST

Patent Document

Patent Document 1: Japanese Patent No. 6254977

SUMMARY OF THE INVENTION

Problem to be Solved by the Invention

In the above current detection circuit, it is necessary to provide two current detection circuits each composed of a shunt resistor, a current detection wire, and a differential amplifier, and provide another differential amplifier for processing current detection outputs from the two circuits, thus having problems such as increase in the manufacturing cost due to addition of a component and a circuit, and increase in a circuit area where components are mounted.

The present disclosure has been made to solve the above problem, and an object of the present disclosure is to provide a detection circuit which accurately detects current or voltage by reducing the influence of interference with electromagnetic noise, while decreasing addition of a component and a circuit as compared to conventional art.

Means to Solve the Problem

A detection circuit according to the present disclosure includes: a detector interposed on a path of current or voltage in an electric circuit; a differential amplifier which outputs voltage according to the current or the voltage detected by the detector; a plus-side detection wire connected between a plus input terminal of the differential amplifier and one end of both ends at which the detector is connected to the path; a minus-side detection wire connected between a minus input terminal of the differential amplifier and another end of both ends at which the detector is connected to the path; at least one first detection wire connected in parallel to at least a part of the plus-side detection wire between the one end of the detector and the plus input terminal of the differential amplifier; and at least one second detection wire connected in parallel to at least a part of the minus-side detection wire between the other end of the detector and the minus input terminal of the differential amplifier. The first detection wire and the second detection wire are arranged in the electric circuit so as to, by induced voltages generated due to external electromagnetic noise, cancel out induced voltages generated on the plus-side detection wire and the minus-side detection wire due to the electromagnetic noise.

Effect of the Invention

The present disclosure provides, in a detection circuit, an effect of reducing the influence of interference from electromagnetic noise, while decreasing addition of a component and a circuit as compared to conventional art.

BRIEF DESCRIPTION OF THE DRAWINGS

FIG. 2 is a schematic diagram schematically illustrating the heights of induced voltages generated on detection wires due to interference with electromagnetic noise.

DESCRIPTION OF EMBODIMENTS

In a configuration of the present disclosure, a detection circuit incorporated in an electric circuit and using a resistor as a detector is a current detection circuit, and a detection circuit incorporated in an electric circuit and using a capacitor as a detector is a voltage detection circuit. The voltage detection circuit configured as described above detects DC voltage stored in the capacitor and is capable of detecting voltage even in a state in which current does not flow through the capacitor.

Hereinafter, in the present disclosure, the current detection circuit using a resistor as a detector is described as an example. However, the voltage detection circuit using a capacitor as a detector may be applied, that is, the current detection circuit and the voltage detection circuit are included in the scope of the present disclosure. In a case of not discriminating the current detection circuit and the voltage detection circuit from each other, they are both referred to as a detection circuit.

Embodiment 1

Figure 1:
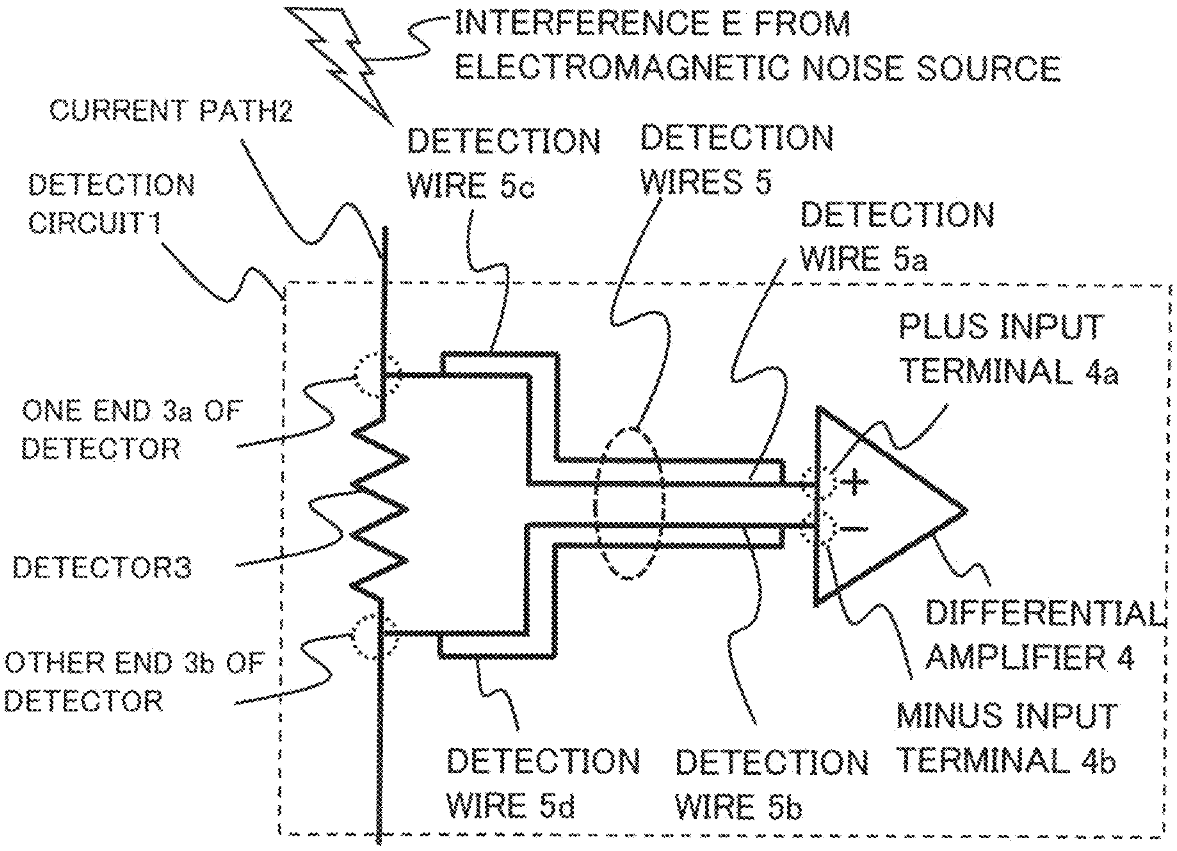
FIG. 1 is a schematic diagram schematically showing a configuration example of a detection circuit according to embodiment 1 of the present disclosure.

FIG. 1 is a schematic diagram schematically showing a configuration example of a detection circuit 1 according to embodiment 1 of the present disclosure. Hereinafter, description will be given using the current detection circuit as an example of the detection circuit 1.

The detection circuit 1 includes a current path 2 of an electric circuit, a detector 3 interposed on the current path 2, a differential amplifier 4, a detection wire 5*a* (plus-side detection wire) connecting a plus input terminal 4*a* (+ input terminal) which is an input part of the differential amplifier 4 and one end 3*a* of the detector 3, a detection wire 5*b* (minus-side detection wire) connecting a minus input terminal 4*b* (− input terminal) which is an input part of the differential amplifier 4 and another end 3*b* of the detector 3, a detection wire 5*c* connected in parallel to at least a part of the detection wire 5*a* between the plus input terminal 4*a* (+ input terminal) of the differential amplifier 4 and the one end 3*a* of the detector 3, and a detection wire 5*d* connected in parallel to at least a part of the detection wire 5*b* between the minus input terminal 4*b* (− input terminal) of the differential amplifier 4 and the other end 3*b* of the detector 3. Hereinafter, a plurality of the detection wires (in FIG. 1, detection wires 5*a* to 5*d*) may be collectively referred to as detection wires 5.

The detection wires 5 may include circuit components for making electric connection.

The detection circuit 1 detects or measures voltage generated between both ends of the detector 3 (i.e., between the one end 3*a* and the other end 3*b* of the detector 3), by an output of the differential amplifier 4, to detect current flowing through the detector 3, and also to derive a current value thereof and obtain various information such as change in the current.

The detector 3 is a resistor for inputting current of the current path 2 which is a detection or measurement target, as voltage, to the differential amplifier 4.

In the present disclosure, a current path refers to a path through which main current flows when the electric circuit operates. A voltage path refers to a path through which main current does not flow in circuit operation, as for voltage of the capacitor interposed between a power supply and a GND (ground), for example.

In the present disclosure, the configuration example of the detection circuit 1 is described using the current path 2, and meanwhile, both of the current path and the voltage path may be collectively referred to as a path 2.

The detector 3 is a circuit component that generates voltage according to a physical quantity (i.e., current or voltage) that is a detection or measurement target on the path 2, and is formed by a resistor, a capacitor, or the like in accordance with a purpose of detection or measurement.

When the detection circuit 1 is subjected to interference E from an external electromagnetic noise source, if the position relationships between the noise source and the respective detection wires 5*a* to 5*d* are equal to each other, induced voltages (which are the same as interference voltages; hereinafter, the same applies) at the same level are generated on the detection wires 5*a* to 5*d*, but if the position relationships between the noise source and the respective detection wires 5*a* to 5*d* are different from each other, different induced voltages are generated on the detection wires 5*a* to 5*d*.

FIG. 2 is a schematic diagram schematically illustrating the heights of the induced voltages generated on the detection wires 5*a* to 5*d* due to interference of electromagnetic noise. In a conventional detection circuit 1, detection wires 5 between the detector 3 and the differential amplifier 4 are formed by two detection wires 5*a* and 5*b* respectively connected to a pair of the plus input terminal 4*a* (+ input terminal) and the minus input terminal 4*b* (− input terminal) of the differential amplifier 4.

Here, if the position relationships between the noise source and the respective detection wires 5*a* and 5*b* are different from each other, different induced voltages are generated on the detection wires 5*a* and 5*b*, so that voltage corresponding to a difference between the induced voltages generated on the detection wires 5*a* and 5*b* is outputted from the differential amplifier 4. As a result, accuracy of detection for current by the detection circuit 1 is influenced.

Hereinafter, a method for reducing the difference between the induced voltages generated on the detection wires 5*a* and 5*b* will be described.

Here, for simplifying description, the induced voltages generated on the detection wires 5*a* and 5*b* are denoted as induced voltage Va and induced voltage Vb, and it is assumed that the induced voltage Va>the induced voltage Vb is satisfied in the position relationships between the noise source and the respective detection wires 5*a* and 5*b*.

As shown in FIG. 1, in addition to the pair of detection wires 5*a* and 5*b*, another pair of detection wires 5*c* and 5*d* are provided between the detector 3, and the plus input terminal 4*a* (+ input terminal) and the minus input terminal 4*b* (− input terminal) of the differential amplifier 4. The detection wire 5*c* is connected in parallel to the detection wire 5*a*, between the plus input terminal 4*a* (+ input terminal) of the differential amplifier 4 and the one end 3*a* of the detector 3, and the detection wire 5*d* is connected in parallel to the detection wire 5*b*, between the minus input terminal 4*b* (− input terminal) of the differential amplifier 4 and the other end 3*b* of the detector 3.

Here, where the respective induced voltages generated on the detection wires 5*c* and 5*d* are denoted as induced voltage Vc and induced voltage Vd, wiring is made in the electric circuit with such arrangement that satisfies the induced voltage Vd>the induced voltage Vc in the position relationships between the noise source and the detection wires 5*c* and 5*d*.

Further, difference voltage between the induced voltage generated on the detection wire 5 connected to the plus input terminal 4*a* of the differential amplifier 4 and the induced voltage generated on the detection wire 5 connected to the minus input terminal 4*b* of the differential amplifier 4 is calculated.

At this time, a plurality of pairs composed of each of the detection wires 5 connected to the plus input terminal 4*a* of the differential amplifier 4 and each of the detection wires 5 connected to the minus input terminal 4*b* of the differential amplifier 4, are specified. Then, regarding each specified pair of the detection wires 5, voltage obtained by subtracting the induced voltage generated on the detection wire 5 connected to the minus input terminal 4*b* from the induced voltage generated on the detection wire 5 connected to the plus input terminal 4*a* is calculated.

Specifically, in FIG. 1 and FIG. 2, regarding the detection wires 5*a* and 5*b* as a pair, the polarity of voltage corresponding to a difference when the induced voltage Vb generated on the detection wire 5 connected to the minus input terminal 4*b* of the differential amplifier 4 is subtracted from the induced voltage Va generated on the detection wire 5 connected to the plus input terminal 4*a* of the differential amplifier 4 (i.e., induced voltage Va-induced voltage Vb), is a plus polarity (+ polarity) from a relationship of the induced voltage Va>the induced voltage Vb. Hereinafter, the voltage corresponding to the difference between the induced voltages Va and Vb is denoted as difference voltage VDab.

Similarly, regarding the detection wires 5*c* and 5*d* as a pair, the polarity of voltage corresponding to a difference when the induced voltage Vd generated on the detection wire 5 connected to the minus input terminal 4*b* of the differential amplifier 4 is subtracted from the induced voltage Vc generated on the detection wire 5 connected to the plus input terminal 4*a* of the differential amplifier 4 (i.e., induced voltage Vc-induced voltage Vd), is a minus polarity (− polarity) from a relationship of the induced voltage Vd>the induced voltage Vc. Hereinafter, the voltage corresponding to the difference between the induced voltages Vc and Vd is denoted as difference voltage VDcd.

Here, arrangement of the detection wires 5*c* and 5*d* is calculated so that the difference voltage VDcd of the detection wires 5*c* and 5*d* has an absolute value equal to and a sign different from the absolute value of the difference voltage VDab, and the detection wires 5*c* and 5*d* are thus arranged in the electric circuit.

As described above, the difference voltages VDab and VDcd between the pair of detection wires 5*a* and 5*b* and between the pair of detection wires 5*c* and 5*d* are set to be different in polarity and equal in absolute value, whereby, when the difference voltages VDab and VDcd are inputted to the differential amplifier 4, the induced voltages Va to Vd generated on the detection wires 5*a* to 5*d* are canceled out with each other in the differential amplifier 4. This can also be described as a cancellation effect being exerted among the induced voltages Va to Vd. As a result, difference voltage between the induced voltages included in the output of the differential amplifier 4 in the conventional detection circuit 1 is reduced, whereby it becomes possible to accurately detect current in the detection circuit 1.

Induced voltage generated on the detection wire 5 due to interference of electromagnetic noise is an induced electromotive force and is caused, as voltage, mainly by change per unit time in a magnetic flux interlinked with the detection wire 5 from the noise source. Therefore, the induced voltage can be expressed irrespective of current.

This is shown in Expression 1. Considering Expression 1, it is desirable that the detection wires 5*a* to 5*d* are arranged so that difference voltage included in the output of the differential amplifier 4 becomes close to zero.

[Mathematical 1]

$$Vn \sim d\varphi/dt \qquad \text{(Expression 1)}$$

Here, Vn and dφ are as follows.

Vn: an induced electromotive force generated on the detection wire 5 dφ: a magnetic flux interlinked with the detection wire 5 from the noise source dφ/dt: change per unit time in a magnetic flux interlinked with the detection wire from the noise source Further, the detection wires 5*c* and 5*d* may each include at least one detection wire, and each detection wire included in the detection wire 5*c* may be set to be paired with each detection wire included in the detection wire 5*d*. In this case, the total number of the detection wires 5*a* to 5*d* is a multiple of 2.

Among the detection wires 5 of the detection circuit 1, the induced voltage generated on each detection wire 5 is biased due to the position relationship with the external electromagnetic noise, so that detection accuracy for current or voltage is lowered and control of the electric circuit is likely to be unbalanced. Regarding such a problem, the above-described configuration is adopted, whereby it is possible to cancel out the biases of the induced voltages generated on the respective detection wires 5 and suppress lowering of detection accuracy, merely by increasing the detection wires 5 of the detection circuit 1 without newly providing electric components, as compared to conventional art.

That is, the detection circuit 1 of the present disclosure can be expressed as including: a detector 3 interposed on a path 2 of current or voltage in an electric circuit; a differential amplifier 4 which outputs voltage according to the current or the voltage detected by the detector 3; a plus-side detection wire 5*a* connected between a plus input terminal 4*a* of the differential amplifier 4 and one end 3*a* of both ends at which the detector 3 is connected to the path 2 for the current or the voltage in the electric circuit; a minus-side detection wire 5*b* connected between a minus input terminal 4*b* of the differential amplifier 4 and another end 3*b* of both ends; at least one first detection wire 5*c* connected in parallel to at least a part of the plus-side detection wire 5*a* between the one end 3*a* of the detector 3 and the plus input terminal 4*a* of the differential amplifier 4; and at least one second detection wire 5*d* connected in parallel to at least a part of the minus-side detection wire 5*b* between the other end of the detector 3 and the minus input terminal 4*b* of the differential amplifier 4, wherein the first detection wire 5*c* and the second detection wire 5*d* are arranged in the electric circuit so as to, by induced voltages generated due to external electromagnetic noise, cancel out induced voltages generated on the plus-side detection wire 5*a* and the minus-side detection wire 5*b* due to the electromagnetic noise.

In addition, in the detection circuit 1 of the present disclosure, it can be expressed that each detection wire included in the first detection wire 5*c* is paired with each detection wire included in the second detection wire 5*d*, and a total number of the plus-side detection wire 5*a*, the minus-side detection wire 5*b*, the first detection wire 5*c*, and the second detection wire 5*d* is a multiple of 2.

In addition, in the detection circuit 1 of the present disclosure, it can be expressed that the first detection wire 5*c* and the second detection wire 5*d* are arranged so that output voltage obtained by the differential amplifier 4 combining first difference voltage VDab which is a difference between the induced voltages on the plus-side detection wire 5*a* and the minus-side detection wire 5*b* and second difference voltage VDcd which is a difference between the induced voltages on the first detection wire and the second detection wire, becomes 0.

In addition, in the detection circuit 1 of the present disclosure, it can be expressed that, in a case where the detector 3 is a resistor, the detection circuit 1 operates as a current detection circuit which detects or measures a value of current or voltage present in a main circuit to which the resistor is electrically connected, on the basis of voltage generated between both ends of the resistor when current flows therethrough. The resistor in this case is also called a shunt resistor.

In addition, in the detection circuit 1 of the present disclosure, it can be expressed that, in a case where the detector 3 is a capacitor, the detection circuit 1 operates as a voltage detection circuit which detects or measures a value of current or voltage present in a main circuit to which the capacitor is electrically connected, on the basis of voltage stored in the capacitor.

Figure 3:
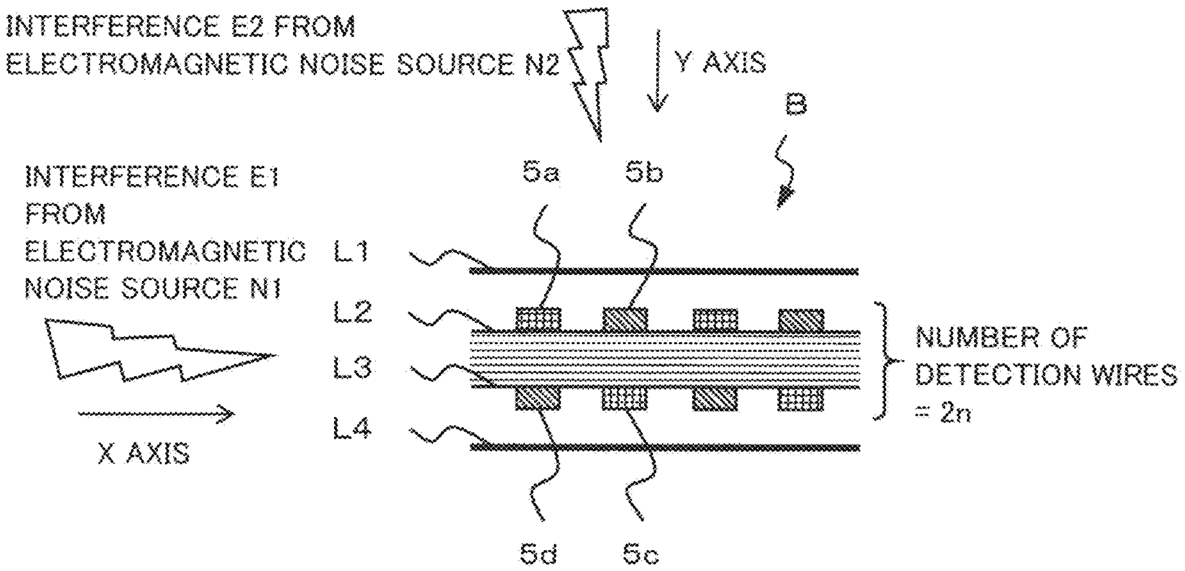
FIG. 3 is a configuration diagram illustrating a configuration in which pairs of detection wires of which the polarities of difference voltages are different are arranged using a multilayer board.

FIG. 3 is a configuration diagram illustrating a configuration in which pairs of detection wires of which the polarities of difference voltages are different are arranged using a multilayer board.

In FIG. 3, description will be given using a four-layer board B as an example of the multilayer board. For facilitating description, a first layer surface L1 of the four-layer board B may be referred to as a 1/4 layer, a second layer surface L2 may be referred to as a 2/4 layer, a third layer surface L3 may be referred to as a 3/4 layer, and a fourth layer surface L4 may be referred to as a 4/4 layer.

As shown in FIG. 3, a direction parallel to the board surface is defined as an X-axis direction, and a direction from left to right in the X-axis direction is defined as a positive direction of the X axis. A direction perpendicular to the board surface is defined as a Y-axis direction, and a direction from up to down in the Y-axis direction is defined as a positive direction of the Y axis.

As shown in FIG. 3, the detection wires 5*a* and 5*b* are provided at the 2/4 layer, and the detection wires 5*c* and 5*d* are provided at the 3/4 layer. At this time, at the same layer, the wire connected to the plus input terminal 4*a* (+ input terminal) of the differential amplifier 4 and the wire connected to the minus input terminal 4*b* (− input terminal) are arranged so as to be adjacent to each other, and at different layers, the wire connected to the input terminal 4*a* (+ input terminal) of the differential amplifier 4 and the wire connected to the minus input terminal 4*b* (− input terminal) are arranged so as to be opposed to each other. Here, at the 2/4 layer, the detection wires 5*a* and 5*b* connected to the respective input terminals 4*a* and 4*b* having different polarities, of the differential amplifier 4, are arranged so as to be adjacent to each other. At the 3/4 layer, the detection wires 5*c* and 5*d* connected to the respective input terminals 4*a* and 4*b* having different polarities, of the differential amplifier 4, are arranged so as to be adjacent to each other. At the 2/4 layer and the 3/4 layer, the detection wires 5*a* and 5*d*, and the detection wires 5*b* and 5*c*, connected to the respective input terminals 4*a* and 4*b* having different polarities, of the differential amplifier 4, are arranged so as to be respectively opposed to each other. That is, focusing on the two polarities of the plus input terminal 4*a* and the minus input terminal 4*b* of the differential amplifier 4, the detection wires 5*a* to 5*d* arranged at the 2/4 layer and the 3/4 layer of the four-layer board B appear in a staggered form in a cross-section.

Further, like the pair of detection wires 5*a* and 5*b* for detecting or measuring a physical quantity of the detector 3 and the pair of detection wires 5*c* and 5*d* additionally connected in parallel to the respective detection wires 5*a* and 5*b*, the detection wires 5 of the detection circuit 1 are arranged such that the number of the wires is a multiple of 2. Therefore, in the example in FIG. 3, at the 2/4 layer and the 3/4 layer of the four-layer board B, 2*n* detection wires 5 including the detection wires 5*a* to 5*d* are arranged as pairs. Here, n is a positive number.

Next, a case where interferences of electromagnetic noises come in the positive directions of the X axis and the Y axis to the detection wires 5*a* to 5*d* arranged in the four-layer board B shown in FIG. 3, will be described. In FIG. 3, as an example of interference of electromagnetic noise, it is assumed that there are interference E1 in the positive direction of the X axis from an electromagnetic noise source N1 and interference E2 in the positive direction of the Y axis from an electromagnetic noise source N2.

In general, the induced voltage generated on the detection wire 5 is greater at a position closer to the noise source. Therefore, in the X-axis direction, “the induced voltage Va on the detection wire 5*a*>the induced voltage Vb on the detection wire 5*b*” and “the induced voltage Vd on the detection wire 5*d*>the induced voltage Vc on the detection wire 5*c*” are satisfied.

As in the method for calculating the difference voltage between the induced voltages generated on the pair of detection wires 5 as described in FIG. 2, the polarity of the difference voltage VDab between the pair of the detection wires 5*a* and 5*b* is a plus polarity (+ polarity), and the polarity of the difference voltage VDcd between the pair of detection wires 5*c* and 5*d* is a minus polarity (− polarity).

Thus, when the induced voltages Va to Vd on the detection wires 5*a* to 5*d* arranged in the X-axis direction are inputted to the differential amplifier 4, the differential amplifier 4 can output voltage in which the induced voltages Va to Vd as an influence of the electromagnetic noise on the detection wires 5*a* to 5*d* are combined and canceled out with each other. That is, with respect to the X-axis direction, by arranging the detection wires 5 as shown in FIG. 3, the induced voltages Va to Vd are canceled out by being combined in the differential amplifier 4, whereby the influence of the interference E1 on the output voltage can be made zero.

Where the output voltage obtained by the differential amplifier 4 combining the induced voltages Va to Vd generated on the detection wires 5*a* to 5*d* due to the interference E1 in the X-axis direction as described above is denoted by Vo1, Vo1 is represented by the following Expression 2.

[Mathematical 2]

$$\text{Induced voltage } (Va) \text{ on detection wire } 5a - \text{induced voltage } (Vb) \text{ on detection wire } 5b = \text{difference voltage } VDab \qquad \text{(Expression 2)}$$

$$(VDab\text{: assumed to be a positive value "}+V1\text{"})$$

$$\text{Induced voltage } (Vc) \text{ on detection wire } 5c - \text{induced voltage } (Vd) \text{ on detection wire } 5d = \text{difference voltage } VDcd$$

$$(VDcd\text{: assumed to be a negative value "}-V1\text{"})$$

$$\text{Output voltage } (Vo1) = [\text{induced voltage } (Va) \text{ on detection wire } 5a - \text{induced voltage } (Vb) \text{ on detection wire } 5b] +$$

-continued $$[\text{induced voltage } (Vc) \text{ on detection wire } 5c - \text{induced voltage } (Vd) \text{ on detection wire } 5d] = \text{difference voltage } VDab + \text{difference voltage } VDcd = +V1 + (-V1) = 0$$

The output voltage (Vo1) can also be represented by Expression 3.

[Mathematical 3]

$$\text{Output voltage } (Vo1) = \text{induced voltage on detection wire } 5a - \text{induced voltage on detection wire } 5b + \text{induced voltage on detection wire } 5c - \text{induced voltage on detection wire } 5d = 0 \quad \text{(Expression 3)}$$

Also for the Y-axis direction, similarly, "the induced voltage Va on the detection wire 5*a*>the induced voltage Vd on the detection wire 5*d*" and "the induced voltage Vb on the detection wire 5*b*>the induced voltage Vc on the detection wire 5*c*" are satisfied.

As in the method for calculating the difference voltage between the induced voltages generated on the pair of detection wires 5 as described in FIG. 2, the polarity of the difference voltage VDad between the pair of detection wires 5*a* and 5*d* is a plus polarity (+ polarity), and the polarity of the difference voltage VDcb between the pair of detection wires 5*b* and 5*c* is a minus polarity (− polarity).

Thus, when the induced voltages Va to Vd on the detection wires 5*a* to 5*d* arranged in the Y-axis direction are inputted to the differential amplifier 4, the differential amplifier 4 can output voltage in which the induced voltages Va to Vd as an influence of the electromagnetic noise on the detection wires 5*a* to 5*d* are combined and canceled out with each other. That is, with respect to the Y-axis direction, by arranging the detection wires 5 as shown in FIG. 3, the induced voltages Va to Vd are canceled out by being combined in the differential amplifier 4, whereby the influence of the interference E2 on the output voltage can be made zero.

Where the output voltage obtained by the differential amplifier 4 combining the induced voltages Va to Vd generated on the detection wires 5*a* to 5*d* due to the interference E2 in the Y-axis direction as described above is denoted by Vo2, Vo2 is represented by the following Expression 4.

[Mathematical 4]

$$\text{Induced voltage } (Va) \text{ on detection wire } 5a - \text{induced voltage } (Vd) \text{ on detection wire } 5d = \text{difference voltage } VDad \quad \text{(Expression 4)}$$

$$(VDad\text{: assumed to be a positive value "}+V2\text{"})$$

$$\text{Induced voltage } (Vc) \text{ on detection wire } 5c - \text{induced voltage } (Vb) \text{ on detection wire } 5b = \text{difference voltage } VDcb$$

$$(VDcb\text{: assumed to be a negative value "}-V2\text{"})$$

$$\text{Output voltage } (Vo2) = [\text{induced voltage } (Va) \text{ on detection wire } 5a - \text{induced voltage } (Vd) \text{ on detection wire } 5d] +$$

-continued $$[\text{induced voltage } (Vc) \text{ on detection wire } 5c - \text{induced voltage } (Vb) \text{ on detection wire } 5b] = \text{difference voltage } VDad + \text{difference voltage } VDcb = +V2 + (-V2) = 0$$

The output voltage (Vo2) can also be represented by Expression 5.

[Mathematical 5]

$$\text{Output voltage } (Vo2) = \text{induced voltage on detection wire } 5a - \text{induced voltage on detection wire } 5d + \text{induced voltage on detection wire } 5c - \text{induced voltage on detection wire } 5b = \text{induced voltage on detection wire } 5a - \text{induced voltage on detection wire } 5b + \text{induced voltage on detection wire } 5c - \text{induced voltage on detection wire } 5d = 0 \quad \text{(Expression 5)}$$

According to Expressions 2 and 4, with the configuration made as shown in FIG. 2, respective components of the induced voltages generated on the detection wires 5*a* to 5*d* are inputted to the differential amplifier 4 and thus are cancelled out with each other to be zero, with respect to both of the interference E1 in the X-axis direction and the interference E2 in the Y-axis direction.

According to Expressions 3 and 5, it is found that the output voltages Vo1 and Vo2 are in equivalent relationships using the detection wires 5*a* to 5*d.*

That is, the direction in which the electromagnetic noise causes interference can be considered while being decomposed into the horizontal direction (X-axis direction) of the board surface of the multilayer board and the direction (Y-axis direction) perpendicular to the board surface, and therefore, in no matter which direction with respect to the multilayer board the electromagnetic noise interferes, the output is made while the influences of the induced voltages generated on the detection wires 5 are canceled out with each other in the differential amplifier 4, as described above.

Thus, it can be said that the structure of the detection wires 5*a* to 5*d* arranged in the multilayer board as shown in FIG. 3 has an effect of canceling out influences of interference of electromagnetic noise.

Further, depending on the way of arranging the detection wires 5 of the detection circuit 1, a cancellation effect is exerted with respect to the influences of interferences from a plurality of noise sources present inside and outside the board of the electric circuit, whereby the influences of the noise sources can be reduced.

In order to reduce the influence of interference from electromagnetic noise on the detection circuit 1, it is desirable to arrange the detection wires 5 in the above-described manner while considering the arrangement positions of the detector 3 and the differential amplifier 4 in the detection circuit 1 mounted to the electric circuit, the specifications of the circuit board, the number of wires and a wiring space that are permitted in terms of designing, and the like.

In FIG. 1 to FIG. 3, the example in which there are four detection wires 5 has been described. However, in mounting of the detection circuit 1 to the electric circuit, it suffices that a plurality of pairs of detection wires 5 can be arranged between the detector 3 and the differential amplifier 4 so that the sum of difference voltages of the respective pairs becomes zero. Therefore, if the number of the detection wires 5 arranged in the electric circuit is set at a multiple of 2 (i.e., 2*n*; n is a positive number), the detection wires 5 can form n pairs.

The layers where the detection wires 5 of the detection circuit 1 are arranged are not limited to the 2/4 layer and the 3/4 layer in the example shown in FIG. 3. In addition, the layers where the detection wires 5 are arranged are not limited to adjacent layers of the multilayer board, and may be layers with one or more layers interposed therebetween. That is, in the example in FIG. 3, the detection wires 5 may be arranged at the 2/4 layer and the 4/4 layer.

The number of layers of the multilayer board may be arbitrary, and a six-layer board, an eight-layer board, or the like may be adopted. The multilayer board applicable here is a board having a plurality of board surfaces where wiring can be made, and may be a both-surface board. With the front and back surfaces of the both-surface board regarded as two layers that are a 1/2 layer and a 2/2 layer, the detection wires 5 may be arranged in accordance with the above-described configuration, in mounting the detection circuit 1 on the front and back surfaces of the both-surface board.

That is, in the detection circuit 1 of the present disclosure, it can be expressed that, at the same layer of the multilayer board, each detection wire 5 included in the plus-side detection wire 5*a* and the first detection wire 5*c* is arranged so as to be adjacent to any of detection wires 5 included in the minus-side detection wire 5*b* and the second detection wire 5*d*, and at different layers of the multilayer board, each detection wire 5 included in the plus-side detection wire 5*a* and the first detection wire 5*c* is arranged so as to be opposed to any of detection wires 5 included in the minus-side detection wire 5*b* and the second detection wire 5*d*.

Figure 4:
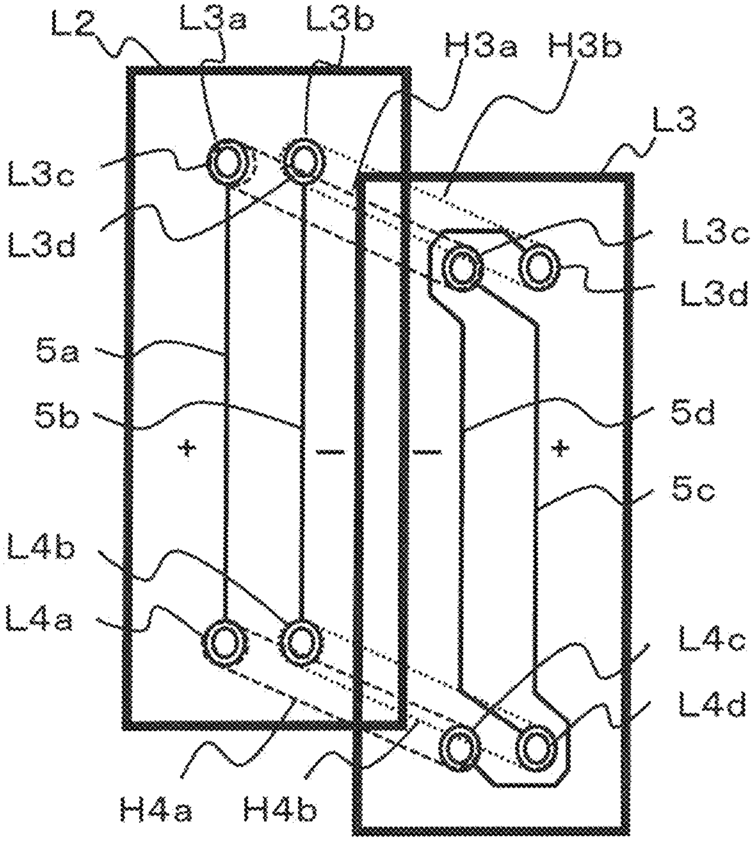
FIG. 4 is a schematic diagram schematically showing a configuration example in which detection wires of the detection circuit are arranged at a plurality of wiring layers of the multilayer board.

FIG. 4 is a schematic diagram schematically showing a configuration example in which the detection wires 5 of the detection circuit 1 are arranged at a plurality of wiring layers of the multilayer board. Description will be given using the four-layer board B as an example of the multilayer board.

Among the wiring layers of the four-layer board B, at the 2/4 layer (second layer surface L2), the detection circuit 1 has lands L3*a* and L3*b* at the one end 3*a* and the other end 3*b* of the detector 3 and has lands L4*a* and L4*b* at the plus input terminal (+ input terminal) and the minus input terminal (− input terminal) of the differential amplifier 4. Then, the detection wire 5*a* connects the land L3*a* on the detector 3 side and the land L4*a* on the differential amplifier 4 side without detouring around a land, and the detection wire 5*b* connects the land L3*b* on the detector 3 side and the land L4*b* on the differential amplifier 4 side without detouring around a land.

Among the wiring layers of the four-layer board B, at the 3/4 layer (third layer surface L3), lands L3*c* and L3*d* are provided at positions respectively corresponding to the lands L3*a* and L3*b* on the detector 3 side, and lands L4*c* and L4*d* are provided at positions respectively corresponding to the lands L4*a* and L4*b* on the differential amplifier 4 side. Then, the detection wire 5*c* connects the land L3*c* and the land L4*c* while detouring around the land L4*d*, and the detection wire 5*d* connects the land L3*d* and the land L4*d* while detouring around the land L3*c*.

Between the 2/4 layer and the 3/4 layer of the wiring layers of the four-layer board B, a through-hole H3*a*, a through-hole H3*b*, a through-hole H4*a*, and a through-hole H4*b* electrically connect the 2/4 layer and the 3/4 layer. Between the 2/4 layer and the 3/4 layer, the land L3*a* and the land L3*c* are connected via the through-hole H3*a*, the land L3*b* and the land L3*d* are connected via the through-hole H3*b*, the land L4*a* and the land L4*c* are connected via the through-hole H4*a*, and the land L4*b* and the land L4*d* are connected via the through-hole H4*b*. The lands may be regarded as parts of the through-holes.

With this configuration, the polarities of the detection wires 5 arranged in different layers (e.g., the 2/4 layer and the 3/4 layer) can be set in a staggered form. The polarities of the detection wires 5 refer to the polarities of the plus input terminal 4*a* and the minus input terminal 4*b* of the differential amplifier 4 to which the detection wires 5 are connected.

At this time, the detection wire 5*c* and the detection wire 5*d* may be arranged so as to be point-symmetric with respect to the intersection of a line connecting the land L3*c* and the land L4*d* and a line connecting the land L3*d* and the land L4*c* (i.e., the center of gravity among the land L3*c*, the land L3*d*, the land L4*d*, and the land L4*c*), and the lengths or the numbers of times of detouring of the detection wire 5*c* and the detection wire 5*d* may be equalized, for example. In this way, the wiring structure for the detection wires (here, the detection wires 5*c* and 5*d*) to be added to the detection wires 5*a* and 5*b* in the detection circuit 1 is designed in consideration of interference from the noise source, whereby it is possible to enhance the effect of reducing the influence of interference from the noise source on the detection wires 5 in the detection circuit 1.

In FIG. 4, the detection wires 5 in the detection circuit 1 are arranged at the 2/4 layer and the 3/4 layer of the four-layer board B. However, without limitation to this example, the detection wires 5 may be arranged at other layers, or the detection wires 5 may be arranged at three or more layers. That is, it suffices that, at the wiring layers of the multilayer board, a plurality of pairs of detection wires 5 are arranged so as to pass such positions that can cancel out the influence of interferences from one or more noise sources, between the detector 3 and the differential amplifier 4 in the detection circuit 1.

In addition to arrangement of the plurality of pairs of detection wires 5, the arrangement positions and lengths of the through-holes may be determined in consideration of interferences from one or more noise sources, whereby it is possible to obtain a wiring structure having a higher effect of reducing the influence of interference from electromagnetic noise. Instead of the through-holes, via-holes may be used.

That is, the detection circuit 1 of the present disclosure can be expressed as including: through-holes provided at both ends of each of the plus-side detection wire 5*a* and the minus-side detection wire 5*b* arranged at a first layer of the multilayer board; and the first detection wire 5*c* and the second detection wire 5*d* arranged at a second layer of the multilayer board electrically connected with the first layer via the through-holes, wherein both ends of the plus-side detection wire 5*a* are respectively connected to both ends of the first detection wire 5*c* via the through-holes, both ends of the minus-side detection wire 5*b* are respectively connected to both ends of the second detection wire 5*d* via the through-holes, and a pair of wires composed of the first detection wire 5*c* and the second detection wire 5*d* have equal lengths and are arranged so as to be point-symmetric with respect to a center of gravity among connection parts where the first detection wire 5*c* and the second detection wire 5*d*, and the through-holes, are connected to each other.

Figure 5:
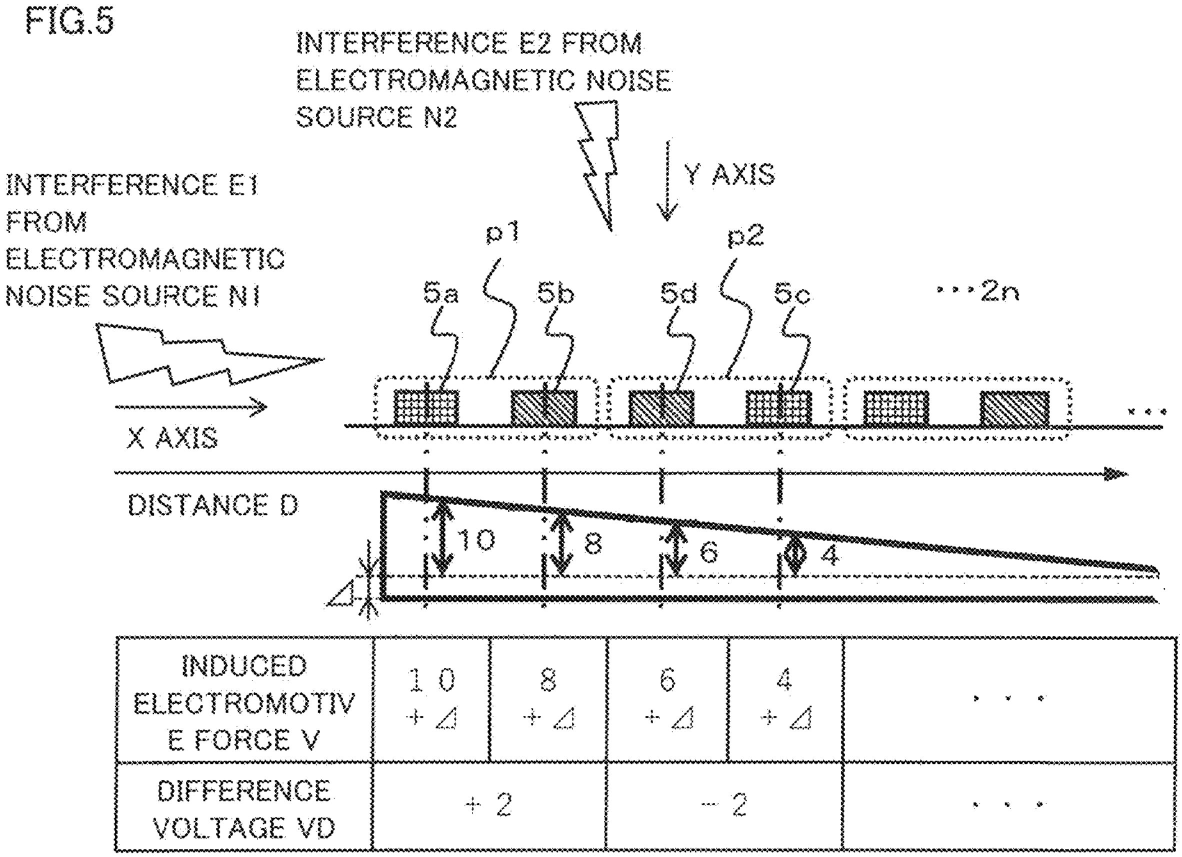
FIG. 5 is a configuration diagram schematically showing a configuration example in which detection wires of the detection circuit are arranged at the same layer of the board.

FIG. 5 is a schematic diagram schematically showing a configuration example in which the detection wires 5 of the detection circuit 1 are arranged at the same layer of the board.

At the same layer of the board, a plurality of pairs of detection wires 5 led from both ends (one end 3*a* and other end 3*b*) of the detector 3 in the detection circuit 1 are arranged. At this time, two detection wires 5 included in adjacent pairs and arranged so as to be adjacent to each other are arranged so as to be connected to the same-polarity input terminal of the differential amplifier 4. That is, of the detection wires 5 included in adjacent pairs, the detection wires 5 having a plus polarity and connected to the plus input terminal 4*a* of the differential amplifier 4 are arranged so as to be adjacent to each other, and the detection wires 5 having a minus polarity and connected to the minus input terminal 4*b* of the differential amplifier 4 are arranged so as to be adjacent to each other.

In the example in FIG. 5, detection wires 5*a*, 5*b*, 5*c*, 5*d*, . . . , 5 (2*n* (n is a positive number)) are arranged at the same layer of the board such that a pair p1 of the detection wires 5*a* and 5*b* and a pair p2 of the detection wires 5*c* and 5*d* are adjacent to each other. Then, the detection wires 5*b* and 5*d* included in the pair p1 and the pair p2 are the detection wires 5 having a minus polarity (− polarity) and to be connected to the minus input terminal 4*b* (− input terminal) of the differential amplifier 4, and therefore are arranged so as to be adjacent to each other. In addition, regarding the detection wires 5*a* and 5*c* having a plus polarity (+ polarity) and to be connected to the plus input terminal 4*a* (+ input terminal) of the differential amplifier 4, in a case where the detection wire 5*a*, 5*c* is adjacent to a pair of detection wires 5 other than the pair p1 and the pair p2, the detection wire 5*a*, 5*c* is arranged so as to be adjacent to the detection wire 5 having the same plus polarity and included in the other pair.

In FIG. 5, a direction parallel to the board surface is defined as the X-axis direction, and a case where interferences of electromagnetic noises come in the positive directions of the X axis and the Y axis to the detection wires 5 arranged in the board, will be described. In FIG. 5, as an example of interference of electromagnetic noise, it is assumed that there are interference E1 in the positive direction of the X axis from an electromagnetic noise source N1 and interference E2 in the positive direction of the Y axis from an electromagnetic noise source N2.

Here, regarding the interference E2 in the Y-axis direction which is a direction perpendicular to the board surface, the detection wires 5*a* to 5*d* are arranged on the same plane and induced voltages due to the interference E2 are generated equally, so that the induced voltages are ideally canceled out in the differential amplifier 4.

Meanwhile, regarding the interference E1 in the X-axis direction which is a direction parallel to the board surface, where the direction of the interference E1 from the noise source N1 is the positive direction of the X axis, the magnitude order of the influences of the interference E1 on the detection wires 5*a* to 5*d* is, from the one closest to the noise source N1, the detection wire 5*a*>the detection wire 5*b*>the detection wire 5*d*>the detection wire 5*c*, and the intensity order of the induced voltages generated on the detection wires 5*a* to 5*d* is the induced voltage Va>the induced voltage Vb>the induced voltage Vd>the induced voltage Vc. In FIG. 5, an induced electromotive force V decreases in proportion to a distance D between each detection wire 5*a* to 5*d* and the noise source N1, i.e., Va=10+Δ, Vb=8+Δ, Vd=6+Δ, and then Vc=4+Δ, so that difference voltages VD are VDab=+2 and VDcd=−2 and thus induced voltages having opposite polarities are generated. Accordingly, the induced voltages generated on the detection wires 5*a* to 5*d* become zero by being combined in the differential amplifier 4. Here, since the description is given only for the differences of the induced voltages generated on the detection wires 5*a* to 5*d*, the absolute values of the respective induced electromotive forces V are written in a simplified manner using A (delta).

As described above, at the same layer of the board, a plurality of pairs of detection wires 5 are arranged consecutively such that the detection wires 5 having the same polarity and included in adjacent pairs are adjacent to each other, whereby it becomes possible to cancel out the influence of interference from a noise source.

In order to obtain such an effect, the detection wires 5 are arranged so that the absolute values of the difference voltages VDab, VDbd, VDdc become equal to each other. Thus, the difference voltage VDab between the induced voltages generated on the pair of detection wires 5*a* and 5*b* has a plus polarity, the difference voltage VDcd between the induced voltages generated on the pair of detection wires 5*c* and 5*d* has a minus polarity, and the absolute values of the difference voltage VDab and the difference voltage VDcd become equal to each other, so that the induced voltages Va to Vd generated on the detection wires 5*a* to 5*d* can be canceled out with each other.

Further, as shown in FIG. 5, in an environment in which induced voltage depending on the distance D from the noise source is generated on each detection wire 5 in the detection circuit 1, in a case where wiring can be made such that the absolute values of difference voltages of a plurality of pairs of detection wires 5 are equal to each other and the polarities of difference voltages of the adjacent pairs are different from each other, not only the number of the detection wires 5 is set at a multiple of 2 but also the number of the pairs of detection wires 5 may be set at a multiple of 2. Thus, a result of combining all the difference voltages of the pairs becomes zero, so that it becomes easy to configure the cancellation effect for interference in circuit designing.

Also in FIG. 5, in order to reduce the influence of interference from electromagnetic noise on the detection circuit 1, it is desirable to arrange the detection wires 5 in the above-described manner while considering the arrangement positions of the detector 3 and the differential amplifier 4 in the detection circuit 1 mounted to the electric circuit, the specifications of the circuit board, the number of wires and a wiring space that are permitted in terms of designing, and the like.

That is, in the detection circuit 1 of the present disclosure, it can be expressed that, at the same surface of the board, a plurality of pairs composed of each detection wire 5 included in the plus-side detection wire 5*a* and the first detection wire 5*c* and each detection wire 5 included in the minus-side detection wire 5*b* and the second detection wire 5*d* are arranged in parallel, and two detection wires 5 adjacent to each other and included in two adjacent pairs among the plurality of pairs are connected to the plus input terminal 4*a* or the minus input terminal 4*b* of the differential amplifier 4.

Embodiment 2

Figure 6:
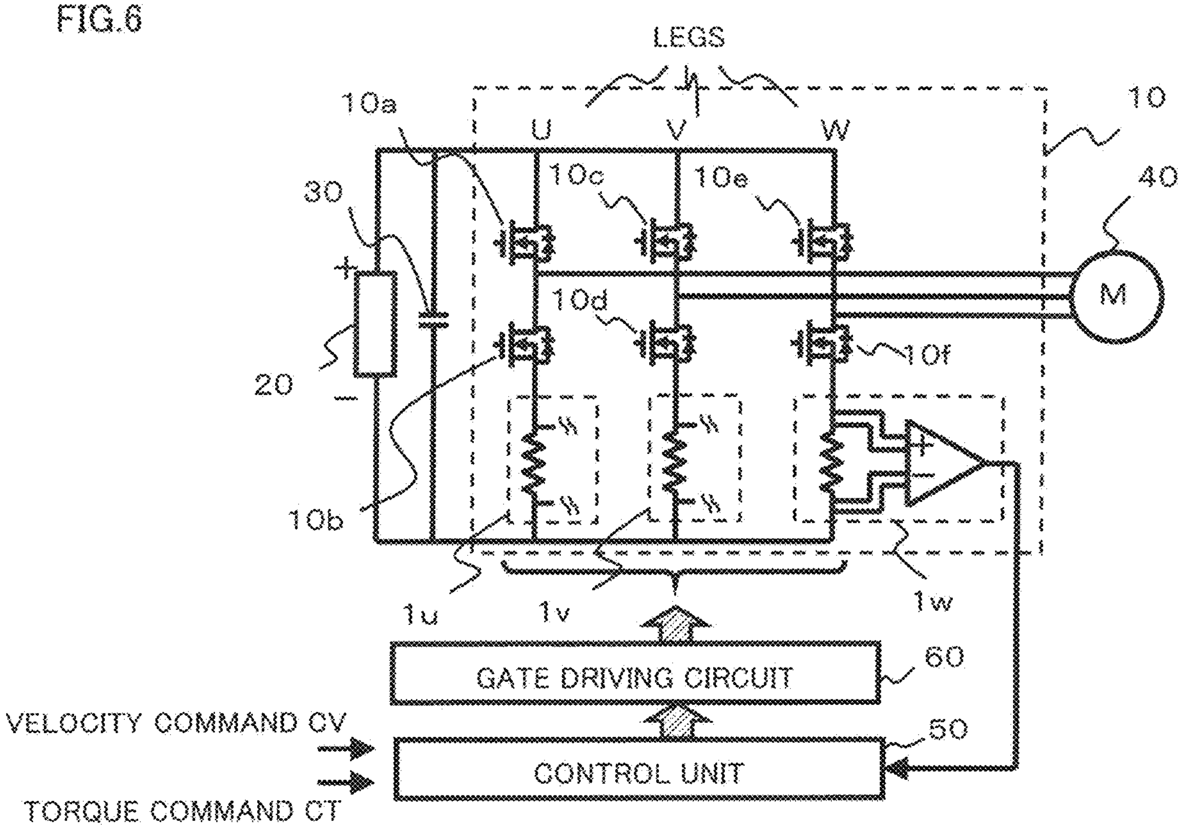
FIG. 6 is a configuration diagram showing a configuration example in which a detection circuit is mounted to an inverter, according to embodiment 2 of the present disclosure.

FIG. 6 is a configuration diagram showing a configuration example in which the detection circuit 1 is mounted to an inverter, according to embodiment 2 of the present disclosure. Here, description will be given using a three-phase inverter 10 as an example of the inverter.

The three-phase inverter 10 is connected to a DC voltage source 20 which is a power supply for a circuit of the three-phase inverter 10, and a motor 40 as an output destination from the circuit.

A control unit 50 controls a gate driving circuit 60 on the basis of information on a signal CV of a torque command for the motor 40, a signal CT of a velocity command therefor, and currents flowing through detection circuits 1*u*, 1*v*, 1*w* connected in series to the respective phases of the three-phase inverter 10, to drive the gates of switching elements 10*a*, 10*b*, 10*c*, 10*d*, 10*e*, 10*f* composing the three-phase inverter 10, thus controlling the motor 40.

In the three-phase inverter 10, the switching elements 10*a*, 10*b* with diodes connected in antiparallel thereto and the detection circuit 1*u* are connected in series, to form U phase. Such a configuration may be referred to as a leg. Hereinafter, a leg for U phase is referred to as a leg U.

Similarly, the switching elements 10*c*, 10*d* and the detection circuit 1*v* are connected in series, to form V phase (hereinafter, a leg for V phase is referred to as a leg V), and the switching elements 10*e*, 10*f* and the detection circuit 1*w* are connected in series, to form W phase (hereinafter, a leg for W phase is referred to as a leg W). Then, the legs U, V, W are connected in parallel to the DC voltage source 20 and the smoothing capacitor 30.

An intermediate point between the switching elements 10*a*, 10*b* connected in series in the leg U is connected to a U terminal of the motor 40, an intermediate point between the switching elements 10*c*, 10*d* connected in series in the leg V is connected to a V terminal of the motor 40, and an intermediate point between the switching elements 10*e*, 10*f* connected in series in the leg W is connected to a W terminal of the motor 40. Then, outputs of the detection circuits 1*u*, 1*v*, 1*w* are inputted to the control unit 50.

The configurations of the detection circuits 1*u*, 1*v*, 1*w* are the same as the circuit configuration using a resistor as the detector 3 as described in FIG. 1, and therefore the description thereof is omitted.

In such a circuit in which a plurality of switching elements are included and current paths are switched in accordance with switching states as in the three-phase inverter 10 shown in FIG. 6, a counter electromotive force obtained by multiplying an inductance component of the current path by current change per time is generated on the wire forming the current path. Where the inductance component is denoted by L and current change per time is denoted by di/dt, the counter electromotive force is represented as Ldi/dt, and in particular, when current is interrupted, the counter electromotive force is maximized. The counter electromotive force serves as a noise source for electromagnetic noise, and causes interference as induced voltage to the detection circuit 1.

In the three-phase inverter 10, there are a plurality of wires as current paths connecting components composing the circuit, and the inductance components L of the wires forming the current paths have various values. Thus, levels of noises (i.e., the counter electromotive forces (Ldi/dt)) caused by noise sources also have various values, and there are a plurality of noise sources of which the position relationships with the detection circuit 1 are not uniform and the noise levels change variously.

For example, while current flowing in U phase is detected by the detection circuit 1*u*, even in a case where there are no changes in the switching states of the switching elements 10*a*, 10*b* and therefore there is no change in U-phase current, when the switching state of any of the switching elements 10*c* to 10*f* forming V phase and W phase has changed, current change occurs with respect to the inductance component of at least any of the wires composing the three-phase inverter 10. A counter electromotive force generated on the wire due to the above current change serves as a noise source, thus causing such an influence that electromagnetic noise interferes with the detection circuit 1*u* for U phase.

Switching operations are performed alternately between the upper arm side and the lower arm side of the three-phase inverter 10. In a case where large current flows from the three-phase inverter 10 to the motor 40, a period in which the switching elements 10*a*, 10*c*, 10*e* on the upper arm side are turned on (i.e., current flows) increases, and meanwhile, a period in which the switching elements 10*b*, 10*d*, 10*f* on the lower arm side are turned on (i.e., current flows) decreases. Then, in FIG. 6, if a period in which currents are detected in the detection circuits 1*u*, 1*v*, 1*w* provided on the lower arm side decreases, current is to be detected before the influence of interference from electromagnetic noise is suppressed, so that current detection accuracy is lowered. Thus, controlling the motor 40 using information on currents flowing through the detection wires 5 of the detection circuits 1*u*, 1*v*, 1*w* in a state of being influenced by interference from electromagnetic noise can cause vibration or an operation malfunction.

In this regard, if the detection circuits 1*u*, 1*v*, 1*w* have the configuration of the present disclosure, the influence of interference from electromagnetic noise can be reduced, and as a result, an effect of suppressing lowering of accuracy in detection for current is obtained. Thus, it becomes possible to perform appropriate control for the motor 40 on the basis of accurate current detection.

That is, the inverter of the present disclosure can be expressed as including: the detection circuit 1 connected in series to each phase; an upper arm and a lower arm which alternately perform switching operations using the switching elements 10*c* to 10*f*; a gate driving circuit 60 which turns on or off the switching elements 10*c* to 10*f*; and a control unit 50 which controls the gate driving circuit 60, wherein the detection circuit 1 is connected in series to the switching element 10*c* to 10*f* in either the upper arm or the lower arm, and inputs the output of the differential amplifier 4 to the control unit 50.

Embodiment 3

Figure 7:
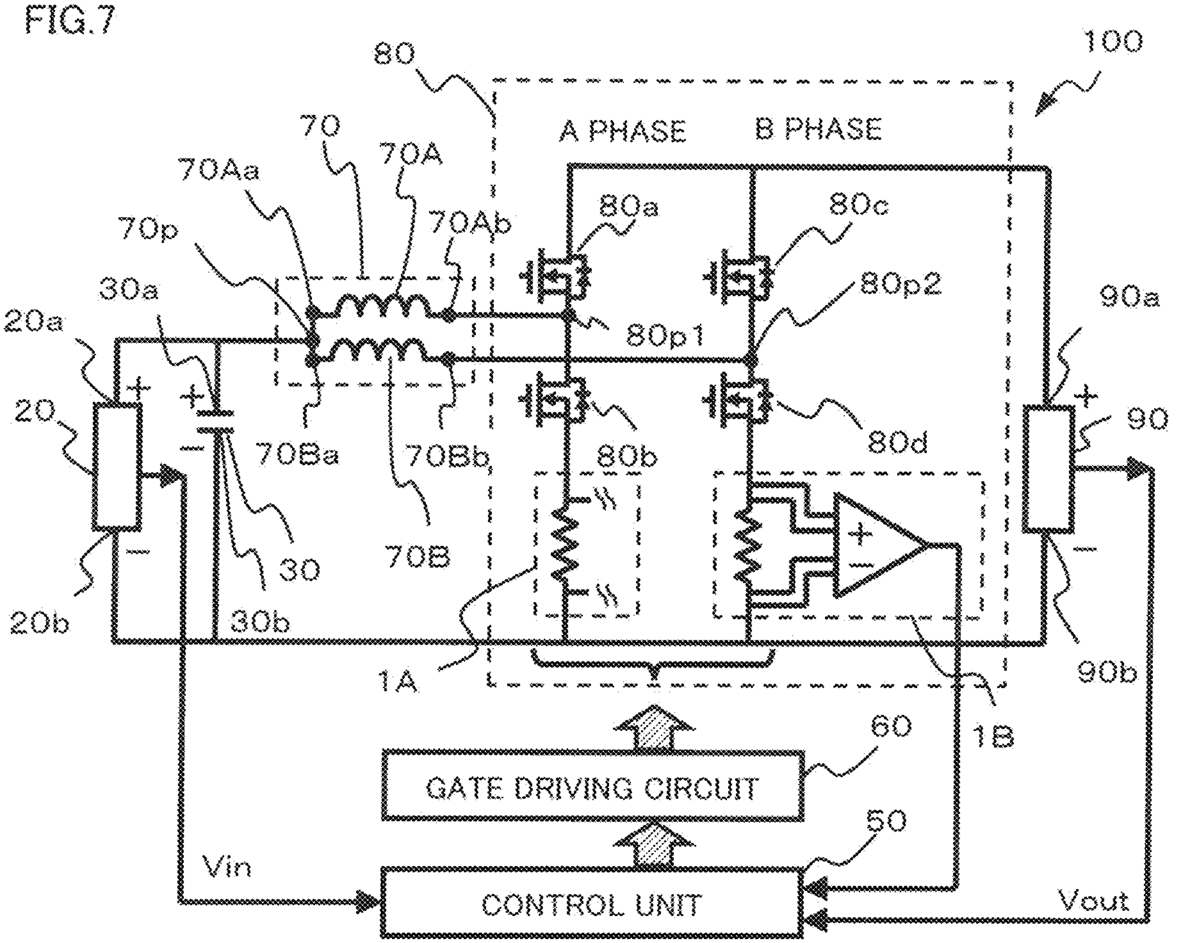
FIG. 7 is a configuration diagram showing a configuration example in which a detection circuit is mounted to a boost converter, according to embodiment 3 of the present disclosure.

FIG. 7 is a configuration diagram showing a configuration example in which the detection circuit 1 is mounted to a boost converter, according to embodiment 3 of the present disclosure. Here, description will be given using a two-phase boost converter 100 as an example of the boost converter.

The two-phase boost converter 100 includes a DC voltage source 20, smoothing capacitors 30, 90, a control unit 50, a gate driving circuit 60, a reactor 70, and a switching circuit 80.

The DC voltage source 20 which is a power supply for the two-phase boost converter 100, and the smoothing capacitor 30, are connected in parallel.

A connection point 70*p* between one end 70Aa of a reactor 70A and one end 70Ba of a reactor 70B connected in parallel is connected to a positive terminal 20*a* of the DC voltage source 20 and a positive terminal 30*a* of the smoothing capacitor 30. The reactors 70A and 70B are regarded as the reactor 70.

The switching circuit 80 is formed such that an A-phase leg in which switching elements 80*a*, 80*b* and a detection circuit 1A are connected in series, a B-phase leg in which switching elements 80*c*, 80*d* and a detection circuit 1B are connected in series, and the smoothing capacitor 90, are connected in parallel.

A positive terminal 90*a* of the smoothing capacitor 90 is connected to the switching elements 80*a*, 80*c*, and a negative terminal 90*b* of the smoothing capacitor 90 is connected to the detection circuits 1A, 1B.

A connection point 80*p*1 between the switching elements 80*a*, 80*b* is connected to another end 70Ab of the reactor 70A, and a connection point 80*p*2 between the switching elements 80*c*, 80*d* is connected to another end 70Bb of the reactor 70B.

Then, the negative terminal 90*b* of the smoothing capacitor 90 is connected to a negative terminal 20*b* of the DC voltage source 20 and a negative terminal 30*b* of the smoothing capacitor 30.

The control unit 50 performs voltage control for obtaining desired output voltage Vout at the smoothing capacitor 90 and current control for making currents flowing through the A-phase leg and the B-phase leg equal to each other, on the basis of information on voltage Vin of the DC voltage source 20, information on voltage of the smoothing capacitor 90, information on current of the A-phase leg in the switching circuit 80 detected by the detection circuit 1A, and information on current of the B-phase leg in the switching circuit 80 detected by the detection circuit 1B. The current control at this time is performed by the control unit 50 controlling the gate driving circuit 60 and then the gate driving circuit 60 controlling and driving the gates of the switching elements 80*a*, 80*b*, 80*c*, 80*d* of the switching circuit 80.

In such a boost converter that includes the switching elements 80*a*, 80*b* and the switching elements 80*c*, 80*d* connected in parallel and forms a plurality of phases as shown in FIG. 7, control for causing currents to flow equally in the respective phases (current balance control) is performed, thereby equalizing the current densities. Thus, currents of the connected switching elements 80*a* to 80*d* are kept within the allowable range, the specifications for heat generation are satisfied, and the power density of a conversion device such as a converter is increased.

However, for example, in a case where the switching elements 80*a* to 80*d* reduced in size for a purpose such as downsizing magnetic components composing a conversion device such as a converter are driven at a high speed, a period in which currents flow through the detection circuits 1A and 1B per one switching operation decreases, and this means that the switching speed increases and current change di/dt per time increases. Thus, a counter electromotive force due to interference from a noise source increases, resulting in a problem that current flowing in each phase cannot be accurately detected.

That is, as in the inverter described in embodiment 2, also in the converter (conversion device), when the switching elements 80*a* to 80*d* are turned on or off, a counter electromotive force obtained by multiplying the inductance component of the wire composing the switching circuit 80 by current change per time is generated to be a noise source for electromagnetic noise, thus influencing the detection circuits 1A and 1B.

With the detection circuit 1 of the present disclosure, as described above, it becomes possible to accurately detect current or voltage while canceling out the influences of counter electromotive forces, in a case of performing high-speed driving of a conversion device or performing current balance control, under interference from an electromagnetic noise.

In FIG. 7, the two-phase boost converter has been described as an example. However, the number of phases of the boost converter is not limited to two. In addition, the configuration of the conversion device is not limited to a boost converter, and the same effects can be obtained as long as a shunt resistor is interposed on a current path.

That is, the conversion device of the present disclosure can be expressed as including: the detection circuit 1 connected in series to each phase; a gate driving circuit 60 which turns on or off current flowing through a reactor 70 and a capacitor 30, using switching elements 80*a* to 80*d*; and a control unit 50 which controls the gate driving circuit, wherein the detection circuit 1 is connected in series to the switching elements 80*a* to 80*d* and inputs the output of the differential amplifier 4 to the control unit 50.

In the present disclosure, a current detection circuit using a resistor on a current path as the detector 3 of the detection circuit 1 has been described as an example. However, as the detector 3 of the detection circuit 1, a capacitor may be used on a voltage path, whereby it is possible to obtain an effect of reducing the influence of interference from electromagnetic noise on a voltage detection circuit.

DESCRIPTION OF THE REFERENCE CHARACTERS

1, 1*u*, 1*v*, 1*w*, 1A, 1B detection circuit
2 path (current path or voltage path)
3 detector
4 differential amplifier
5 detector
5*a* to 5*c* detection wire
10 inverter
10*a* to 10*f*, 80*a* to 80*d* switching element
20 DC voltage source
30, 90 smoothing capacitor
40 motor
50 control unit
60 gate driving circuit
70, 70*a*, 70*b* reactor
80 switching circuit
100 converter (conversion device)

The invention claimed is:

1. A detection circuit of which wiring is made at a multilayer board having at least two layers, the detection circuit comprising:

a detector interposed on a path of current or voltage in an electric circuit;

a differential amplifier which outputs voltage according to the current or the voltage detected by the detector;

a plus-side detection wire connected between a plus input terminal of the differential amplifier and one end of both ends at which the detector is connected to the path of the current or the voltage in the electric circuit;

a minus-side detection wire connected between a minus input terminal of the differential amplifier and another end of both ends;

at least one first detection wire connected in parallel to at least a part of the plus-side detection wire between the one end of the detector and the plus input terminal of the differential amplifier; and at least one second detection wire connected in parallel to at least a part of the minus-side detection wire between the other end of the detector and the minus input terminal of the differential amplifier, wherein at the same layer of the multilayer board, each detection wire included in the plus-side detection wire and the first detection wire is arranged so as to be adjacent to, in a direction parallel to a surface of the multilayer board, any of detection wires included in the minus-side detection wire and the second detection wire, and at different layers of the multilayer board, each detection wire included in the plus-side detection wire and the first detection wire is arranged so as to be opposed to, in a direction perpendicular to the surface of the multilayer board, any of detection wires included in the second detection wire and the minus-side detection wire.

2. The detection circuit according to claim 1, wherein each detection wire included in the first detection wire is paired with each detection wire included in the second detection wire, and a total number of the plus-side detection wire, the minus-side detection wire, the first detection wire, and the second detection wire is a multiple of 2.

3. The detection circuit according to claim 1, wherein the first detection wire and the second detection wire are arranged so that output voltage obtained by the differential amplifier combining first difference voltage which is a difference between the induced voltages on the plus-side detection wire and the minus-side detection wire and second difference voltage which is a difference between the induced voltages on the first detection wire and the second detection wire, becomes 0.

4. The detection circuit according to claim 1, wherein the detector is a resistor, and a value of current or voltage present in a main circuit to which the resistor is electrically connected is detected or measured on the basis of voltage generated between both ends when current flows through the resistor.

5. The detection circuit according to claim 1, wherein the detector is a capacitor, and a value of current or voltage present in a main circuit to which the capacitor is electrically connected is detected or measured on the basis of voltage stored in the capacitor.

6. An inverter comprising:

the detection circuit according to claim 1, connected in series to each phase;

an upper arm and a lower arm which alternately perform switching operations using switching elements;

a gate driving circuit which turns on or off the switching elements; and a controlling circuitry which controls the gate driving circuit, wherein the detection circuit is connected in series to the switching element for each phase in either the upper arm or the lower arm, and inputs the output of the differential amplifier to the controlling circuitry.

7. A conversion device comprising:

the detection circuit according to claim 1, connected in series to each phase;

a gate driving circuit which turns on or off current flowing through a reactor or smoothing capacitor, using switching elements; and a controlling circuitry which controls the gate driving circuit, wherein the detection circuit is connected in series to the switching element for each phase and inputs the output of the differential amplifier to the controlling circuitry.

8. The detection circuit according to claim 2, wherein the first detection wire and the second detection wire are arranged so that output voltage obtained by the differential amplifier combining first difference voltage which is a difference between the induced voltages on the plus-side detection wire and the minus-side detection wire and second difference voltage which is a difference between the induced voltages on the first detection wire and the second detection wire, becomes 0.

9. A detection circuit of which wiring is made at a multilayer board having at least two layers, the detection circuit comprising:

a detector interposed on a path of current or voltage in an electric circuit;

a differential amplifier which outputs voltage according to the current or the voltage detected by the detector;

a plus-side detection wire connected between a plus input terminal of the differential amplifier and one end of both ends at which the detector is connected to the path of the current or the voltage in the electric circuit;

a minus-side detection wire connected between a minus input terminal of the differential amplifier and another end of both ends;

at least one first detection wire connected in parallel to at least a part of the plus-side detection wire between the one end of the detector and the plus input terminal of the differential amplifier;

at least one second detection wire connected in parallel to at least a part of the minus-side detection wire between the other end of the detector and the minus input terminal of the differential amplifier; and through-holes or via-holes provided at both ends of each of the plus-side detection wire and the minus-side detection wire arranged at a first layer of the multilayer board, wherein the first detection wire and the second detection wire are arranged at a second layer of the multilayer board electrically connected with the first layer via the through-holes or the via-holes, both ends of the plus-side detection wire are respectively connected to both ends of the first detection wire via the through-holes or the via-holes, both ends of the minus-side detection wire are respectively connected to both ends of the second detection wire via the through-holes or the via-holes, and a pair of wires composed of the first detection wire and the second detection wire have equal lengths and are arranged so as to be point-symmetric with respect to a center of gravity among connection parts where the first detection wire and the second detection wire, and the through-holes or the via-holes, are connected to each other.

10. The detection circuit according to claim 9, wherein each detection wire included in the first detection wire is paired with each detection wire included in the second detection wire, and a total number of the plus-side detection wire, the minus-side detection wire, the first detection wire, and the second detection wire is a multiple of 2.

11. The detection circuit according to claim 9, wherein the first detection wire and the second detection wire are arranged so that output voltage obtained by the differential amplifier combining first difference voltage which is a difference between the induced voltages on the plus-side detection wire and the minus-side detection wire and second difference voltage which is a difference between the induced voltages on the first detection wire and the second detection wire, becomes 0.

12. The detection circuit according to claim 10, wherein the first detection wire and the second detection wire are arranged so that output voltage obtained by the differential amplifier combining first difference voltage which is a difference between the induced voltages on the plus-side detection wire and the minus-side detection wire and second difference voltage which is a difference between the induced voltages on the first detection wire and the second detection wire, becomes 0.

13. The detection circuit according to claim 9, wherein the detector is a resistor, and a value of current or voltage present in a main circuit to which the resistor is electrically connected is detected or measured on the basis of voltage generated between both ends when current flows through the resistor.

14. The detection circuit according to claim 9, wherein the detector is a capacitor, and a value of current or voltage present in a main circuit to which the capacitor is electrically connected is detected or measured on the basis of voltage stored in the capacitor.

15. A detection circuit of which wiring is made at a board, the detection circuit comprising:

a detector interposed on a path of current or voltage in an electric circuit;

a differential amplifier which outputs voltage according to the current or the voltage detected by the detector;

a plus-side detection wire connected between a plus input terminal of the differential amplifier and one end of both ends at which the detector is connected to the path of the current or the voltage in the electric circuit;

a minus-side detection wire connected between a minus input terminal of the differential amplifier and another end of both ends;

at least one first detection wire connected in parallel to at least a part of the plus-side detection wire between the one end of the detector and the plus input terminal of the differential amplifier; and at least one second detection wire connected in parallel to at least a part of the minus-side detection wire between the other end of the detector and the minus input terminal of the differential amplifier, wherein at the same surface of the board, a plurality of pairs composed of each detection wire included in the plus-side detection wire and the first detection wire and each detection wire included in the minus-side detection wire and the second detection wire are arranged in parallel, and two, of the detection wires, that are adjacent to each other and are included in two adjacent pairs among the plurality of pairs, are connected to the plus input terminal or the minus input terminal of the differential amplifier.

16. The detection circuit according to claim 15, wherein each detection wire included in the first detection wire is paired with each detection wire included in the second detection wire, and a total number of the plus-side detection wire, the minus-side detection wire, the first detection wire, and the second detection wire is a multiple of 2.

17. The detection circuit according to claim 15, wherein the first detection wire and the second detection wire are arranged so that output voltage obtained by the differential amplifier combining first difference voltage which is a difference between the induced voltages on the plus-side detection wire and the minus-side detection wire and second difference voltage which is a difference between the induced voltages on the first detection wire and the second detection wire, becomes 0.

18. The detection circuit according to claim 16, wherein the first detection wire and the second detection wire are arranged so that output voltage obtained by the differential amplifier combining first difference voltage which is a difference between the induced voltages on the plus-side detection wire and the minus-side detection wire and second difference voltage which is a difference between the induced voltages on the first detection wire and the second detection wire, becomes 0.

19. The detection circuit according to claim 15, wherein the detector is a resistor, and a value of current or voltage present in a main circuit to which the resistor is electrically connected is detected or measured on the basis of voltage generated between both ends when current flows through the resistor.

20. The detection circuit according to claim 15, wherein the detector is a capacitor, and a value of current or voltage present in a main circuit to which the capacitor is electrically connected is detected or measured on the basis of voltage stored in the capacitor.

21. An inverter comprising:

a detection circuit connected in series to each phase;

an upper arm and a lower arm which alternately perform switching operations using switching elements;

a gate driving circuit which turns on or off the switching elements; and a controlling circuitry which controls the gate driving circuit, wherein the detection circuit is connected in series to the switching element for each phase in either the upper arm or the lower arm, and inputs the output of the differential amplifier to the controlling circuitry, the detection circuit of which wiring is made at a multilayer board having at least two layers, each detection circuit comprises:

a detector interposed on a path of current or voltage in an electric circuit;

a differential amplifier which outputs voltage according to the current or the voltage detected by the detector;

a plus-side detection wire connected between a plus input terminal of the differential amplifier and one end of both ends at which the detector is connected to the path of the current or the voltage in the electric circuit;

a minus-side detection wire connected between a minus input terminal of the differential amplifier and another end of both ends;

at least one first detection wire connected in parallel to at least a part of the plus-side detection wire between the one end of the detector and the plus input terminal of the differential amplifier; and at least one second detection wire connected in parallel to at least a part of the minus-side detection wire between the other end of the detector and the minus input terminal of the differential amplifier, wherein at the same layer of the multilayer board, each detection wire included in the plus-side detection wire and the first detection wire is arranged so as to be adjacent to, in a direction parallel to a surface of the multilayer board, any of detection wires included in the minus-side detection wire and the second detection wire, and at different layers of the multilayer board, each detection wire included in the plus-side detection wire and the first detection wire is arranged so as to be opposed to, in a direction perpendicular to the surface of the multilayer board, any of detection wires included in the second detection wire and the minus-side detection wire.

22. An inverter comprising:

a detection circuit connected in series to each phase;

an upper arm and a lower arm which alternately perform switching operations using switching elements;

a gate driving circuit which turns on or off the switching elements; and a controlling circuitry which controls the gate driving circuit, wherein the detection circuit is connected in series to the switching element for each phase in either the upper arm or the lower arm, and inputs the output of the differential amplifier to the controlling circuitry, the detection circuit of which wiring is made at a board, each detection circuit comprises:

a detector interposed on a path of current or voltage in an electric circuit;

a differential amplifier which outputs voltage according to the current or the voltage detected by the detector;

a plus-side detection wire connected between a plus input terminal of the differential amplifier and one end of both ends at which the detector is connected to the path of the current or the voltage in the electric circuit;

a minus-side detection wire connected between a minus input terminal of the differential amplifier and another end of both ends;

at least one first detection wire connected in parallel to at least a part of the plus-side detection wire between the one end of the detector and the plus input terminal of the differential amplifier; and at least one second detection wire connected in parallel to at least a part of the minus-side detection wire between the other end of the detector and the minus input terminal of the differential amplifier, wherein at the same surface of the board, a plurality of pairs composed of each detection wire included in the plus-side detection wire and the first detection wire and each detection wire included in the minus-side detection wire and the second detection wire are arranged in parallel, and two, of the detection wires, that are adjacent to each other and are included in two adjacent pairs among the plurality of pairs, are connected to the plus input terminal or the minus input terminal of the differential amplifier.

* * * * *